United States Patent
Yao et al.

(10) Patent No.: US 6,759,342 B2
(45) Date of Patent: Jul. 6, 2004

(54) METHOD OF AVOIDING DIELECTRIC ARCING

(75) Inventors: Chih-Hsiang Yao, Hsin Chu (TW); Lain-Jong Li, Hsin Chu (TW); Bi-Troug Chen, Hsin Chu (TW); Syun-Ming Jan, Hsin Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/269,219

(22) Filed: Oct. 11, 2002

(65) Prior Publication Data

US 2004/0072405 A1 Apr. 15, 2004

(51) Int. Cl.[7] ............................................. H01L 21/302
(52) U.S. Cl. .................... 438/718; 438/464; 438/618
(58) Field of Search ................................ 438/464, 618, 438/718

(56) References Cited

U.S. PATENT DOCUMENTS

| | | | | |
|---|---|---|---|---|
| 6,142,722 A | * | 11/2000 | Genov et al. | 414/217 |
| 6,281,135 B1 | * | 8/2001 | Han et al. | 438/725 |
| 6,374,770 B1 | * | 4/2002 | Lee et al. | 118/723 |

* cited by examiner

Primary Examiner—Long Pham
Assistant Examiner—Wai-Sing Louie
(74) Attorney, Agent, or Firm—Tung & Associates

(57) ABSTRACT

A method for reducing electrical charge imbalances in a semiconductor process wafer including providing a semiconductor process wafer including a dielectric insulating layer; exposing the semiconductor process wafer to a semiconductor process whereby an electrical charge imbalance accumulates in charge imbalance portions of the dielectric insulating layer; and, treating the semiconductor process wafer with a controlled atmosphere of treatment gas including at least one of inert gas and hydrogen to reduce an accumulated charge imbalance in the charge imbalance portions.

18 Claims, 3 Drawing Sheets

METHOD OF AVOIDING DIELECTRIC ARCING

FIELD OF THE INVENTION

This invention generally relates to photolithographic patterning processes and more particularly to a method for reducing photo-induced charge accumulation in a process wafer to reduce or avoid defect producing electrical discharge or arcing phenomena in semiconductor manufacturing processes.

BACKGROUND OF THE INVENTION

As devices become smaller and integration density increases, reactive ion etching (RIE) has become a key process in anisotropic etching of semiconductor features. RIE or ion-enhanced etching works by a combination of physical and chemical mechanisms for achieving selectivity and anisotropicity during the etching process. Generally, plasma assisted anisotropic etching operates in the milliTorr and above range. Generally three processes compete with each other during plasma etching; physical bombardment by ions, chemical etching by radicals and ions, and surface passivation by the deposition of passivating films. In some applications, for example, etching high aspect ratio features such as vias, high density plasma (HDP) etching which has a higher density of ions and operates at lower pressures has been increasingly used in etching high aspect ratio features, for example, with aspect ratios greater than about 3:1.

Another plasma process common in semiconductor manufacturing are plasma assisted chemical vapor deposition (CVD) assisted techniques, including PECVD and HDP-CVD. In particular, high density plasma (HDP) processes, such as electron cyclotron resonance (ECR) processes and induced coupling plasma (ICP) processes have been found to produce high-quality low dielectric constant (e.g., <3.0) carbon doped silicon oxide. Generally, HDP-CVD provides a high density of low energy ions resulting in higher quality films at lower deposition temperatures, compared to for example, PECVD. HDP-CVD is particularly ideal for forming inter-metal dielectric (IMD) insulating oxide layers because of its superior gap filling capability.

An increasingly problematical phenomenon in manufacturing multi-level semiconductor devices is charge accumulation along dielectric insulating layer surfaces and near surface regions as a result of the various semiconductor manufacturing processes including plasma assisted processes such as deposition and anisotropic etching. Depending on the various process parameters such as RF power and bias power, impacting ions and radical may cause the accumulation of charge within the dielectric insulating layers due to charge imbalances caused by non-uniformities in the plasma and charge non-uniformities caused by the etching target. For example, charged species may become incorporated within the surface of the layer, with localized charge accumulation aided by defects formed in the dielectric insulating layer. In addition, ion and radical bombardment may increase the concentration of charged defects at localized portions of the surface, thereby increasing localized charge buildup within the dielectric layer. In addition, conductive interconnect pathways aid the movement of electrical charge preferentially to particular areas of the process wafer. As dielectric insulating layers have decreased in dielectric constant, a corresponding decrease in mechanical strength and hardness properties has lowered the dielectric breakdown threshold. In addition, as feature sizes decrease, the electric field increases for the same amount of charge accumulation or charge imbalance, making dielectric breakdown more likely. Further, lower dielectric constant materials are increasing able to maintain charge imbalance accumulations for longer periods of time. The electrical charge imbalance accumulation and movement to localized areas of the semiconductor wafer also includes a relatively slow on-going time dependent process following charge imbalance creating processes such as RIE.

The problem of arcing or electrical discharge has increasingly become a critical problem for both RIE processes and other semiconductor processes creating electrical charge imbalances in the semiconductor wafer including dielectric insulating layers. In many cases, the charge imbalance accumulation exists for long time periods, for example hours, periodically resulting in spontaneous dielectric breakdown or arcing even in the absence of plasma processes, also referred to as time dependent dielectric arcing (TDDA). The electrical discharge is typically accompanied by mechanical failure causing damage to dielectric including localized micro-cracking.

Arcing damage frequently occurs in the dielectric insulator/metal conductor interfaces, where conductive interconnect lines provide an electrical pathway to preferentially move electrical charges to resulting a localized charge imbalance region in the dielectric insulating layer. The problem is critical since the damage caused by arcing is frequently severe enough to make further processing of the wafer impractical or seriously impact reliability. As a result, arcing damage to the wafer is costly in terms of wafer yield and reliability.

There is therefore a need in the semiconductor processing art to develop a method whereby charge imbalance accumulation in semiconductors is reduced such that arcing including during time dependent dielectric arcing (TDDA) is reduced or avoided thereby avoiding arcing induced defects to the semiconductor wafer to improve wafer yield and device reliability.

It is therefore an object of the invention to provide a method whereby charge imbalance accumulation in semiconductors is reduced such that arcing including during time dependent dielectric arcing (TDDA) is reduced or avoided thereby avoiding arcing induced defects to the semiconductor wafer to improve wafer yield and device reliability while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for reducing electrical charge imbalances in a semiconductor process wafer.

In a first embodiment, the method includes providing a semiconductor process wafer including a dielectric insulating layer; exposing the semiconductor process wafer to a semiconductor process whereby an electrical charge imbalance accumulates in charge imbalance portions of the dielectric insulating layer; and, treating the semiconductor process wafer with a controlled atmosphere of treatment gas including at least one of inert gas and hydrogen to reduce an accumulated charge imbalance in the charge imbalance portions.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
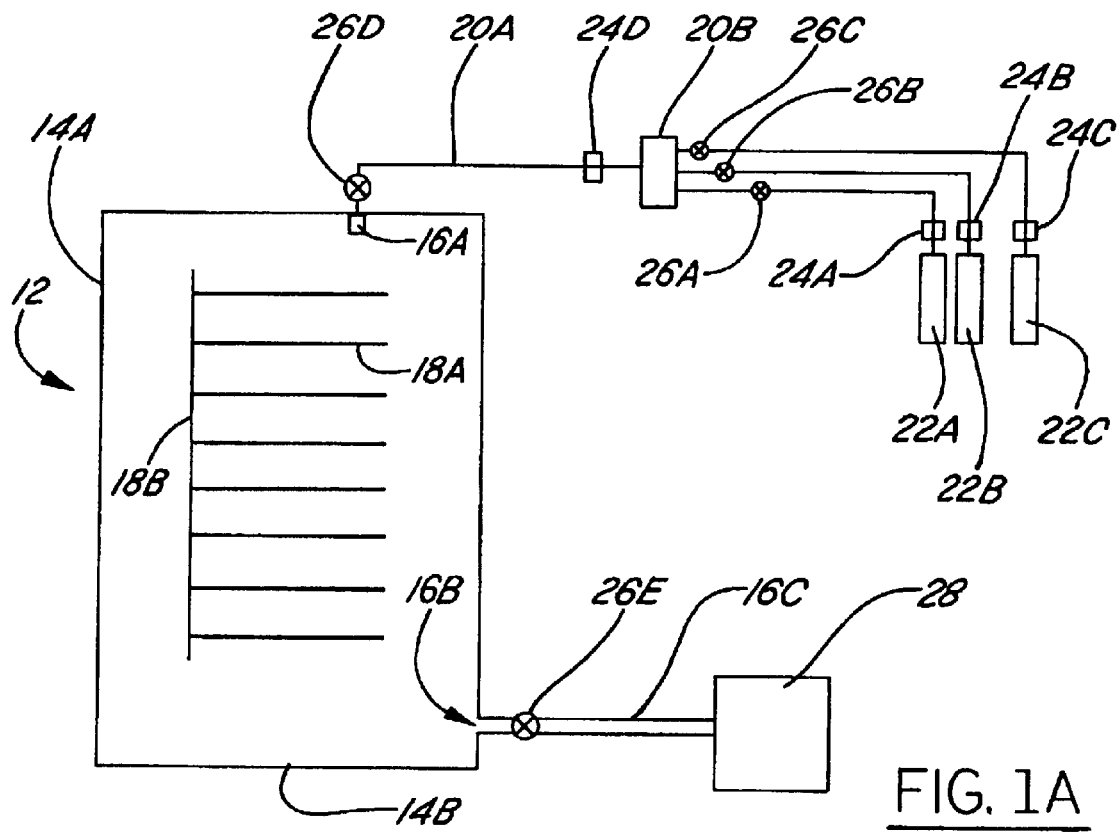
FIGS. 1A–1B are schematic views of exemplary means for treating semiconductor wafers in a charge neutralizing treatment according to the present invention.

Although the present invention is explained by exemplary reference to the photolithographic patterning step of a particular level of a multi-level (multi-layer) semiconductor device it will be appreciated that the present invention of charge neutralization and prevention may be advantageously applied following any electrical charge imbalance producing step including electron or photon lithography and including plasma assisted deposition or etching processes. It will further be appreciated that the charge neutralization treatment, while explained with reference to a carbon doped oxide, it will be appreciated that the method of the present invention may in general be applied to all types of dielectric insulating layers where accumulated electrical charge imbalances form leading to electrical discharge induced defects and which may be advantageously reduced or avoided.

In an exemplary embodiment a semiconductor wafer process surface including at least a portion of a dielectric insulating layer is provided. A photolithographic patterning process is then carried out including exposure of a photoresist layer overlying the dielectric insulating layer to an activating radiation source of photons. Following the exposure of the photoresist layer to activating radiation source of photons, the process wafer is treated (contacted) with a controlled atmosphere of electrical charge neutralizing (treatment) gases. Following the charge neutralizing treatment and photolithographic patterning process, the process wafers are shielded from visible light sources during storage and transport at least prior to a subsequent RIE process.

In one embodiment, the charge neutralization treatment is performed in-situ. For example, following photo-exposure, the process wafer is robotically transferred to a process wafer holder. The process wafer holder is preferably equipped with a means for controllably altering an atmospheric environment within the process wafer holder including a pressure and a treatment gas supply and treatment gas flow controlling means. In another embodiment, the photo-exposure system including at least a wafer stage portion is disposed in a controlled atmosphere environment, including a pressure and a treatment gas supply and treatment gas flow controlling means. Preferably, a demountably detachable atmosphere control chamber (enclosure), attachable to at least sealably surround the wafer stage portion of the photo-exposure system is used to carry out the charge neutralizing treatment in-situ. For example, the atmosphere control chamber preferably includes means for controlling a pressure and means of controllably supplying treatment gases.

In one embodiment, the treatment gas includes individually supplied or mixtures of inert gases, for example, argon and helium. In another embodiment, the treatment gas include preformed mixtures or individually supplied gases to form a gas mixture in the atmosphere control chamber of hydrogen and inert gases, for example, argon and helium.

In another embodiment, the process wafer is shielded from visible light during the charge neutralizing treatment. For example, the atmosphere control chamber and the process wafer holder are preferably substantially opaque to visible light, for example, the chamber enclosing members and process wafer holder enclosing members preferably formed of an opaque material, such as an opaque plastic material, or coated with a light absorbing coating. By the term 'substantially opaque' is meant that greater than about 95 percent of the incident visible light is blocked from transmission.

In another embodiment, following the charge neutralizing treatment, subsequent processes preferably include transport of the process wafers and carrying out of the subsequent processes in an environment shielded from visible light. For example, photolithographic patterning processes subsequent to the photo-exposure process include developing and baking processes, which are preferably performed in an environment substantially shielded from visible light. In the event that light shielding proves unfeasible or costly, a subsequent charge neutralizing treatment may be carried out following wafer exposure of the process wafer to incident light. Further, the charge neutralization treatment may optionally be repeated following subsequent electrical charge imbalance producing processes such as a subsequent reactive ion etching (RIE) process.

In one embodiment, the charge neutralizing treatment is carried out at a pressure of about 10 milliTorr to about 1000 Torr. For example, at atmospheric pressure, the charge neutralization treatment includes flowing an inert gas at about 10 to about 500 sccm, more preferably about 50 to 200 sccm for a period of about 30 seconds to about 30 minutes, more preferably about 1 minute to about 5 minutes. More preferably, the treatment gas is supplied either pre-mixed or individually supplied to form a mixture in the wafer containing means, such as the atmosphere control chamber or the wafer holder, of inert gas and hydrogen to form a volumetric ratio with respect to the total volume of the treatment gas of inert gas to hydrogen of about 1 to 1 to about 10 to 1.

In another embodiment, the charge neutralizing treatment includes periodically injecting charge neutralizing treatment gases into the wafer containing means, followed by an evacuation process, the injection and evacuation steps performed periodically.

For example, it has been found that exposure of the process wafer to photons during the photo-exposure step of a photolithographic patterning process, for example, ultraviolet light (e.g., including wavelengths of less than about 400 nm) that photo-induced electrical charges together with current flow occurs within the various layers of a multi-layered device. As a result, charge imbalances, for example negative charges, accumulate on surfaces and near surface regions of dielectric insulating layers, frequently leading to spontaneous discharge (arcing) or dielectric breakdown over time across the bulk or surfaces of the dielectric insulating layers. As a result, portions of the device, for example at the dielectric/conductive interconnect line interface are locally damaged in previously uncontrollable ways. In addition, the accumulation of charge imbalances can lead to arcing during a reactive ion etching (RIE) process where local charge imbalances cause plasma arcing at portions of the process wafer surface. Spontaneous arcing phenomena (in the absence of plasma processes) are also referred to as time dependent dielectric arcing (TDDA) the charge imbalances believed to be in part due to the formation of dangling bonds or coordinatively unsaturated bonding sites as a result of polymer chain scission occurring during the photo-exposure step. In addition, the photo-exposure step leads to the formation of charged radicals from photo-sensitizers present in the photoresist which may also be related to the formation of charge imbalances in process wafers. The photo-induced charges are believed to migrate by means of conductive pathways and accumulated at dielectric layer surfaces and near surface regions in the process wafer.

It has been found that treatment of the process wafer with inert gases or more preferably, mixtures of hydrogen and inert gases acts to at least partially neutralize a process wafer charge imbalance, for example a negative charge imbalance present on dielectric insulating layer surfaces. It is believed that the treatment with inert gases, preferably including hydrogen, acts to neutralize the excess charges present by charge transfer reactions with the dielectric insulating material or photoresist, thereby neutralizing a charge imbalance.

For example, referring to FIG. 1A is shown an exemplary implementation of the present invention, where a wafer containing means 12, for example a wafer holding container or wafer pod, is shown having an enclosing member 14A sealably attached to a supporting member 14B. Gas inlet 16A is disposed at a first end of the wafer holding container 12, for example in an upper portion of the wafer holding container 12 and a gas outlet 16B is disposed at a second end of the wafer holder 12, so that a gas flow occurs from the inlet 16A to the outlet 16B to contact semiconductor wafers, e.g., 18A supported in wafer support fixture 18B. The inlet 16A is controllably supplied with a charge neutralizing gas by gas supply line 20A from gas manifold 20B where treatment gas sources e.g., 22A, 22B, 22C are mixed prior to being supplied to the wafer holding container 12. Means to controllably supply a gas flow rate, for example, mass flow controllers e.g., 24A, 24B, 24C, included between gas sources 22A, 22B, 22C and gas manifold 20B and mass flow controller 24D disposed between gas manifold 20B and the wafer holding container 12 are preferably provided to controllably supply treatment gases to wafer holding container 12. Gas flow valves 26A, 26B, 26C, 26D are controllably opened and closed to provide a flow of treatment gases. Gas valve 26E is disposed in the gas outlet line 16C which is in flowable communication with vacuum forming means 28, for example a mechanical vacuum pump. In operation, charge neutralizing treatment gases including gas mixtures are passed through the wafer holding container 12 in a continuous manner at a controlled flow rate and pressure or injected periodically followed by a gas contact period which is followed by evacuation. In the injection treatment mode, the steps of injection, gas contact, and evacuation are optionally periodically repeated. Preferably, a controller (not shown) is provided in digital and/or analog communication for controlling a charge neutralizing treatment according to a pre-determined set of controller readable instructions, for example in response to input from pressure sensing means (not shown), for example disposed within the wafer holding container 12, and flow rate sensing means (not shown) to controllably alter flow controlling means, e.g., mass flow controllers 24A, 24B, 24C, 24D, and gas flow valves e.g., 26A, 26B, 26C, 26D and 26E.

In one embodiment, the enclosing member 14A and supporting member 14B are formed of a material that is substantially opaque to visible light, for example transmitting less than about 95 percent of the incident visible light. For example, the wafer holding container is used for transporting the wafers to subsequent processes including an RIE process. For example, referring to FIG. 1B, the wafer holding container is preferably demountably and sealably detached from the gas supply lines, for example gas supply line 20A and the vacuum forming means 28 including a portion of line 16C, and used for transporting the process wafers to a subsequent process, for example, an RIE process. Alternatively a different wafer holding container or wafer pod with opaque wall members may be used where a transfer is made without exposure of the process wafers to visible light. It will be appreciated that the charge neutralizing process may optionally be performed after each instance of exposure of the process wafer to incident light, including ultraviolet or visible light.

Figure 2A:
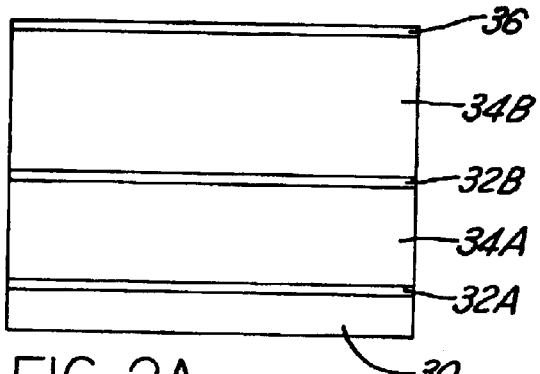
FIGS. 2A–2E are cross sectional side view representations of an exemplary portion of a semiconductor wafer at stages of manufacture according to the present invention.

In an exemplary semiconductor process, referring to FIGS. 2A–2E, are cross sectional representational views showing stages in an exemplary manufacturing process according to an embodiment of the present invention. Referring to FIG. 2A is shown a conductive region 30, for example, copper, formed in a dielectric insulating layer (not shown) having an overlying first etching stop layer 32A, for example, silicon nitride (e.g., SiN). First etching stop layer 32A is formed by a conventional chemical vapor deposition (CVD) process including for example, LPCVD (low pressure CVD), having a thickness of about 300 Angstroms to about 700 Angstroms.

Still referring to FIG. 2A, formed over etching stop layer 32A is first dielectric insulating layer 34A, also referred to as an inter-metal dielectric (IMD) layer formed of, for example, fluorinated silicate glass (FSG) or a low-k (low dielectric constant) silicon oxide based material, e.g., carbon doped silicon dioxide, preferably having a dielectric constant of less than about 3.5. Typically, the first IMD layer 34A is formed having a thickness of about 3000 to about 7000 Angstroms.

Still referring to FIG. 2A, following deposition of the first IMD layer 34A, a second etching stop layer 32B is formed in a similar manner to first etching stop layer 32A, formed of, for example, silicon nitride (e.g., SiN) by an LPCVD process, having a thickness of about 300 Angstroms to about 600 Angstroms. Formed over second etching stop layer 32B is a second IMD layer 34B, also formed of, for example, fluorinated silicate glass (FSG) or a low-k (low dielectric constant) silicon oxide based material, e.g., carbon doped silicon dioxide, preferably having a dielectric constant of less than about 3.5. Typically, the second IMD layer is formed having a thickness about the same or slightly less than the first IMD layer. Formed over the second IMD layer 34B is a bottom anti-reflectance coating (BARC) layer 36 to reduce undesired light reflections from the second IMD layer surface during a photolithographic patterning process. For example, the BARC is formed of silicon oxynitride (e.g., SiON) in an LPCVD process to a thickness of about 1000 to about 1400 Angstroms.

Figure 2B:
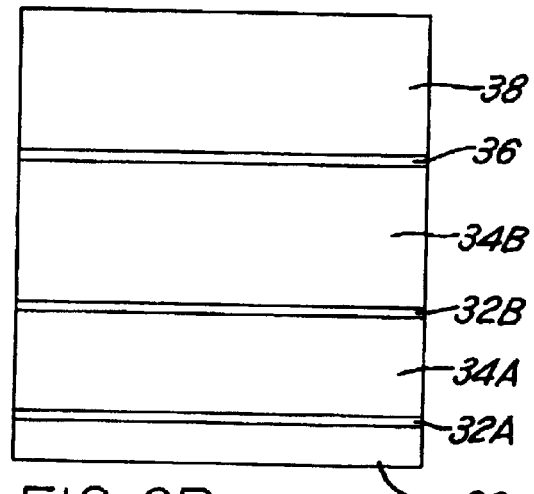

Referring to FIG. 2B, a photoresist layer 38 is formed over the BARC layer 36 by a conventional spin-coating method. Other conventional steps in the photolithographic process including for example, a soft bake of the photoresist prior to photo-exposure are preferably performed in a visible light shielded processing area adjacent to the photo-stepper used for the photo-exposure process. It will be appreciated that the photoresist may be any type of photoresist, for example a deep ultraviolet (DUV) photoresist including a photogenerated acid. In addition, the photoresist layer may be a multi-layer photoresist, for example the uppermost layer of the photoresist being subjected to silylation process after exposure and developed by a plasma process.

Figure 1B:
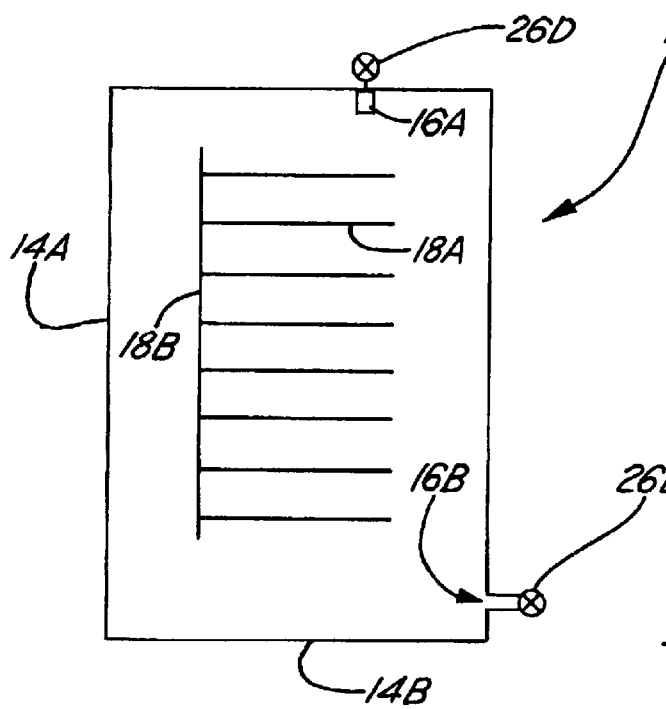

Prior to the photo-exposure process the process wafer is preferably transferred to a transfer station, the transfer station preferably including a wafer holding container as described in FIGS. 1A–1B. Following photo-exposure, for example by a step and scan method to expose the photoresist to ultraviolet light, the process wafer is robotically transferred to the transfer station and the wafer holding container where according to the present invention the process wafer is subjected to a charge neutralizing treatment. Following the charge neutralization treatment, the process wafer is subjected to a post exposure bake (PEB) to further drive off solvents from the photoresist layer and to complete the catalytic acid reactions to increase the solubility of exposed photoresist. In the development process, the photoresist is subjected to conventional methods of development including wet chemical methods such as dipping methods, spin/spray methods, and puddling methods as are known in the art.

Figure 2C:
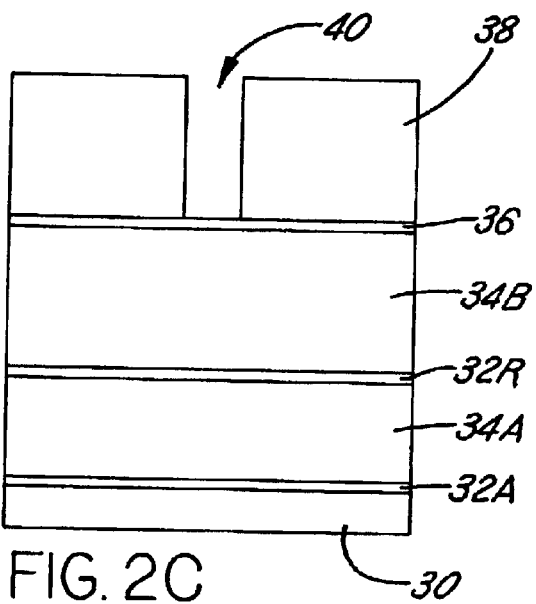

Referring to FIG. 2C, following the development process a etching pattern opening e.g., via opening 40, is formed for carrying out a subsequent reactive ion etching (RIE) process. Optionally, the photoresist is subjected to another baking process following the development process referred to as a post development bake (PDB) to further stabilize the photoresist by promoting further polymer cross-linking reactions. Optionally, the photoresist is subjected to ultraviolet illumination during or following the PDB to further polymer cross-linking to stabilize the photoresist. Following the PDB, the process wafer is transferred to the transfer station and wafer holding container according to preferred embodiments where it is optionally subjected to a second charge neutralization treatment, preferably performed in the event of exposure of the process wafer to incident light during the various photoresist processing stages.

Following the optional second charge neutralization treatment, the process wafer including the wafer holding container is transported to an RIE transfer station for carrying out an RIE process. Preferably, the wafer holding container includes a visible light shielding means, for example, having enclosing members formed of a material substantially opaque to visible light or including a coating substantially opaque to visible light. Preferably, the wafer holding container is demountably and sealably detached from the gas supply lines and the vacuum forming means and used for transporting the process wafers to the RIE process transfer station.

Figure 2D:
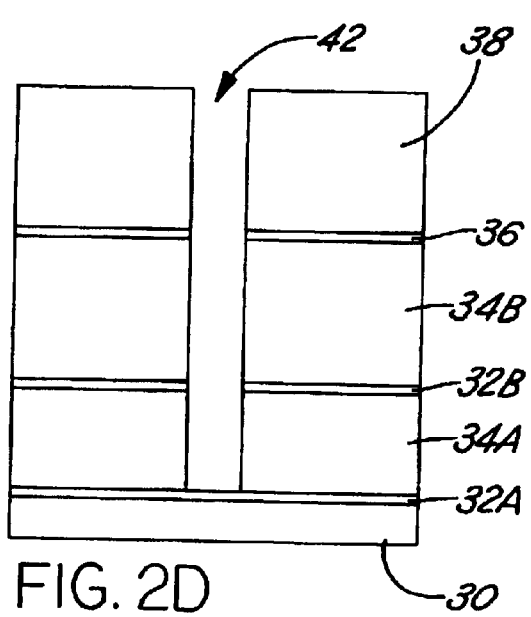

Referring to FIG. 2D a conventional reactive ion etching (RIE) process is carried out to form anisotropically etched opening 42, for example a via opening. For example the anisotropic etching step includes sequential etching steps including conventional plasma etching chemistries formed of combinations of gases including hydrofluorocarbons, fluorocarbons, nitrogen, and oxygen to sequentially etch through a thickness of the BARC layer 36, the second IMD layer 34B, the second etching stop layer 32B, the first IMD layer 34A, and through a thickness of the first etching stop layer 32A to form closed communication with underlying conductive area 30.

Figure 2E:
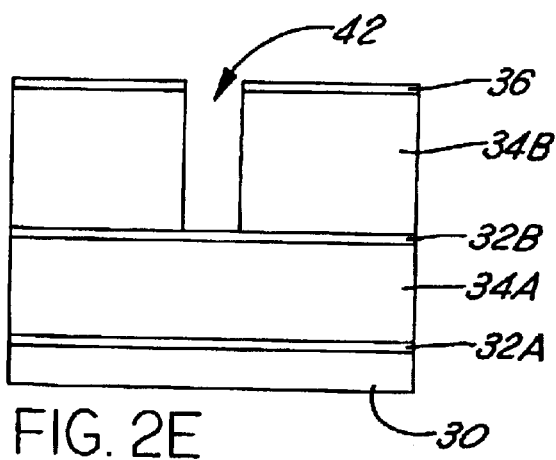

Referring to FIG. 2E, following the RIE process, a plasma ashing process, for example including an oxygen containing plasma chemistry is used to remove the photoresist layer 38 and to remove residual polymeric material from the via opening. Following the RIE and ashing processes, the process wafer is preferably transferred to wafer holding container which is mountably re-attached to gas supply lines and vacuum forming means for carrying out another charge neutralizing treatment according to preferred embodiments.

Figure 3:
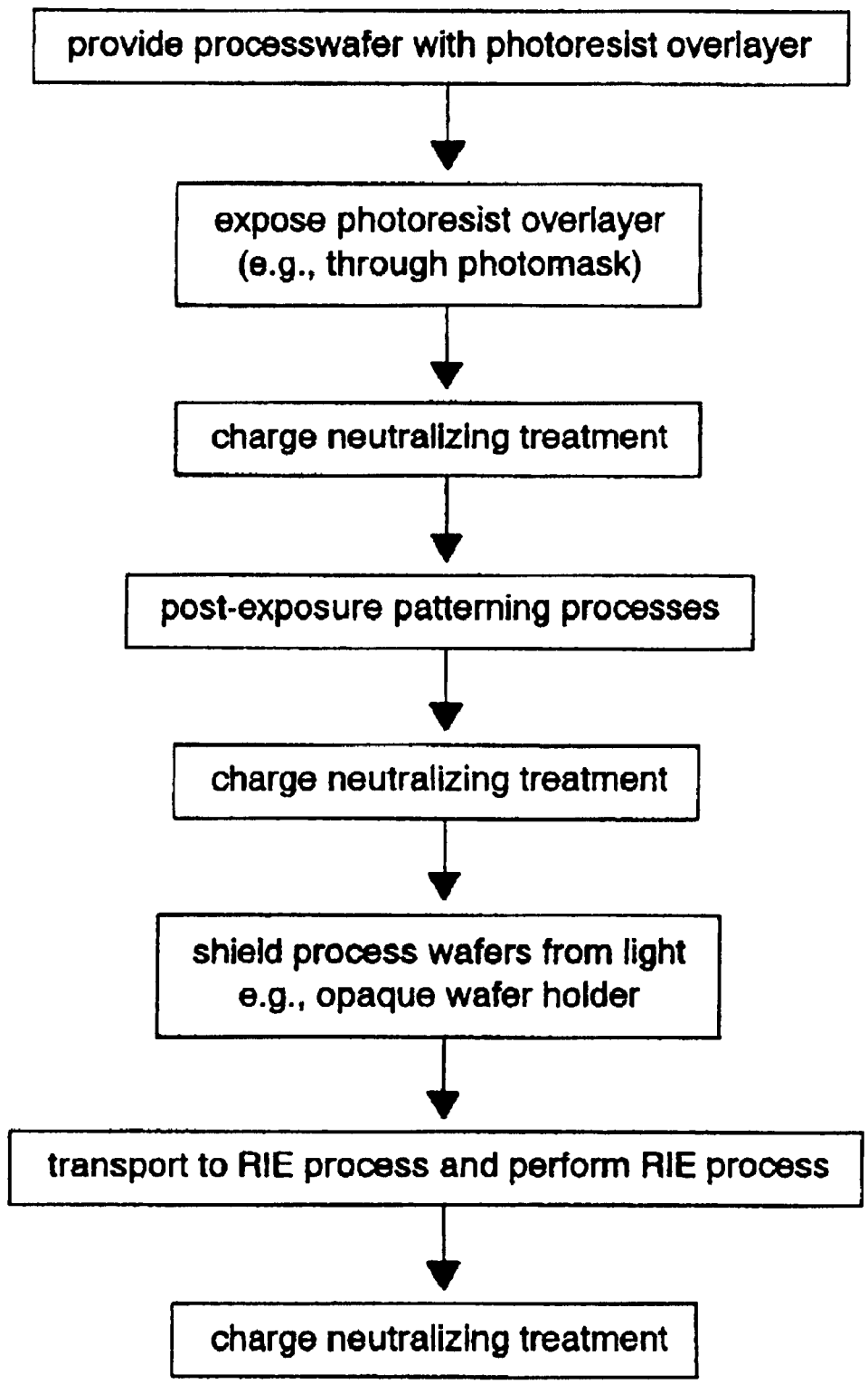
FIG. 3 is an exemplary process flow diagram including several embodiments of the present invention.

Referring to FIG. 3 is shown a process flow diagram including several embodiments of the present invention. In process 301 a semiconductor wafer process wafer including on at least one dielectric insulating layer is provided including at least one photoresist overlayer for forming a photolithographic pattern. In process 303, a photolithographic patterning process is carried out including exposure of the at least one photoresist overlayer to an activating radiation source. In process 305, a charge neutralizing process is carried out according to preferred embodiments. In process 307, post-exposure photolithographic patterning processes are carried out. In optional process 309, at least a second charge neutralizing treatment is carried out, preferably if the process wafer has been exposed to incident light during the post-exposure processes. In process 311, the process wafer is shielded from incident light following the charge neutralizing treatment, for example by providing a wafer holding container with visible light opaque enclosing members. In process 313, the process wafer, preferably in the light shielded wafer holding container is demountably detached from gas supply lines and vacuum forming means for transport to and carrying out an RIE process. In process 315, a third charge neutralizing treatment is optionally performed following the RIE process.

Thus, there has been present a method whereby charge imbalances are reduced to avoid arcing either by spontaneous electrical discharge over time due to electrical charge imbalance producing semiconductor process such as photolithographic processes and RIE processes where plasma arcing is enhanced by the presence of charge imbalances. As a result, arcing induced defects in the semiconductor wafer are reduced to improve wafer yield and device reliability while overcoming other shortcomings and deficiencies of the prior art.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing electrical charge imbalances in a semiconductor process wafer comprising the steps of:
   providing a semiconductor process wafer comprising a dielectric insulating layer;
   exposing the semiconductor process wafer to a semiconductor process whereby an electrical charge imbalance accumulates in charge imbalance portions of the dielectric insulating layer; and,
   treating the semiconductor process wafer with a controlled atmosphere of treatment gas comprising one of a continuous and periodic flow of at least one of inert gas and hydrogen to reduce an accumulated charge imbalance in the charge imbalance portions.

2. The method of claim 1, wherein the semiconductor process includes at least one of a lithographic patterning process, a plasma assisted etching process, and a plasma assisted deposition process.

3. The method of claim 1, wherein the semiconductor process comprises a photolithographic process whereby the electrical charge imbalances accumulates upon exposure of a resist layer overlying the dielectric insulating layer to photons.

4. The method of claim 1, wherein the step of treating comprises an in-situ treatment following the step of exposing including providing a means for controllably contacting the semiconductor process wafer with the treatment gas the means for controllably contacting comprising controllably altering at least one of the treatment gas pressure and the treatment gas flow rate.

5. The method of claim 4, wherein the means for controllably contacting the semiconductor process wafer with the treatment gas includes a demountable sealable enclosure for at least one of storing and transporting the semiconductor process wafer.

6. The method of claim 5, wherein the demountable sealable enclosure comprises a means for shielding the semiconductor process wafer from incident light exposure.

7. The method of claim 1, further comprising the step of shielding the semiconductor process wafer from incident light exposure following the step of treating.

8. The method of claim 1, wherein the treatment gas comprises at least one of argon, helium, and hydrogen.

9. The method of claim 8, wherein the treatment gas comprises a gas mixture having a volumetric ratio with respect to the total volume of treatment gas of inert gas to hydrogen of about 1 to 1 to about 10 to 1.

10. The method of claim 9, wherein the step of treating comprises a continuous flow of treatment gas at a flow rate of about 10 sccm to about 500 sccm for a period of about 30 seconds to about 30 minutes.

11. A method for avoiding or reducing photo-induced electrical charge imbalances leading to electric discharge arcing comprising the steps of:

providing a semiconductor process wafer comprising a dielectric insulating layer and an overlying resist layer for forming a lithographic pattern therein;

exposing the resist layer to an activating source of photons thereby forming electrical charge imbalances in the semiconductor process wafer; and, controllably contacting the semiconductor process wafer with a treatment gas comprising one of a continuous and periodic flow of at least one of inert gas and hydrogen to at least partially neutralize the electrical charge imbalances.

12. The method of claim 11, wherein the step of controllably contacting comprises providing at least one of a controlled pressure and gas flow rate of the treatment gas.

13. The method of claim 11, further comprising transporting the semiconductor process wafer in a portable semiconductor process wafer holder comprising a means for shielding the semiconductor process wafer from incident light exposure following the step of controllably contacting.

14. The method of claim 13, wherein the portable semiconductor process wafer holder is demountably detached from means for controlling a treatment gas pressure and a treatment gas flow rate following the step of treating and prior to transporting the semiconductor process wafer.

15. The method of claim 11, further comprising the step of shielding the semiconductor process wafer from incident light exposure following the step of controllably contacting.

16. The method of claim 11, wherein the treatment gas comprises at least one of argon, helium, and hydrogen.

17. The method of claim 16, wherein the treatment gas comprises a gas mixture including a volumetric ratio with respect to the total volume of treatment gas of inert gas to hydrogen of about 1 to 1 to about 10 to 1.

18. The method of claim 17, wherein the step of controllably contacting comprises a continuous flow of treatment gas at a flow rate about 10 sccm to about 500 sccm for a period of about 30 seconds to about 30 minutes.

* * * * *